(12) United States Patent
Matsushita (10) Patent No.: US 12,406,710 B2
(45) Date of Patent: Sep. 2, 2025

(54) FORMING METHOD OF MEMORY DEVICE

(71) Applicant: Kioxia Corporation, Tokyo (JP)

(72) Inventor: Naoki Matsushita, Seoul (KR)

(73) Assignee: Kioxia Corporation, Tokyo (JP)

( * ) Notice: Subject to any disclaimer, the term of this patent is extended or adjusted under 35 U.S.C. 154(b) by 134 days.

(21) Appl. No.: 18/180,003

(22) Filed: Mar. 7, 2023

(65) Prior Publication Data

US 2024/0087629 A1  Mar. 14, 2024

(30) Foreign Application Priority Data

Sep. 8, 2022  (JP) .................. 2022-143161

(51) Int. Cl.
*G11C 11/16*  (2006.01)

(52) U.S. Cl.
CPC ........ *G11C 11/1659* (2013.01); *G11C 11/161* (2013.01)

(58) Field of Classification Search
CPC .......................... G11C 11/161; G11C 11/1659
USPC ....................................................... 365/158
See application file for complete search history.

(56) References Cited

U.S. PATENT DOCUMENTS

| | | | |
|---|---|---|---|
| 9,013,912 B2 | 4/2015 | Nojiri et al. | |
| 9,524,776 B2 * | 12/2016 | Kawai | G11C 13/0064 |
| 10,854,307 B2 | 12/2020 | Redaelli | |
| 11,049,559 B1 | 6/2021 | Jeon | |
| 11,482,572 B2 | 10/2022 | Kanaya | |
| 2009/0147558 A1 * | 6/2009 | Tamai | H10N 70/20 29/610.1 |
| 2011/0140069 A1 * | 6/2011 | Inoue | H10N 70/028 257/E21.37 |
| 2012/0025386 A1 * | 2/2012 | Murata | H10B 63/20 257/E29.139 |
| 2012/0300532 A1 * | 11/2012 | Yamazaki | G11C 13/0069 365/148 |
| 2014/0191183 A1 * | 7/2014 | Chueh | H10N 70/826 257/4 |
| 2016/0293666 A1 * | 10/2016 | Huang | H10N 70/8836 |
| 2018/0040669 A1 * | 2/2018 | Wu | H10N 70/20 |
| 2018/0277601 A1 * | 9/2018 | Ahn | H10B 63/80 |

FOREIGN PATENT DOCUMENTS

| | | |
|---|---|---|
| JP | 2014049175 A | 3/2014 |
| JP | 2021129071 A | 9/2021 |

* cited by examiner

*Primary Examiner* — Sung Il Cho
(74) *Attorney, Agent, or Firm* — Holtz, Holtz & Volek PC (57) ABSTRACT

According to one embodiment, a memory device includes first interconnects in a first direction, second interconnects in a second direction intersecting the first direction, and memory cells. Each of the memory cells is associated with a set of one of the first interconnects and one of the second interconnects between the first interconnects and the second interconnects and includes a variable resistance element and a switching element which are coupled in series. A forming method of the memory device includes: selecting a memory cell having a highest interconnect resistance from memory cells on which a forming process has not been performed; performing a forming process on a switching element in the selected memory cell; and repeating the selecting and the performing on the memory cells.

15 Claims, 5 Drawing Sheets

FORMING METHOD OF MEMORY DEVICE

CROSS-REFERENCE TO RELATED APPLICATIONS

This application is based upon and claims the benefit of priority from Japanese Patent Application No. 2022-143161, filed Sep. 8, 2022, the entire contents of which are incorporated herein by reference.

FIELD

Embodiments described herein relate generally to a forming method of a memory device.

BACKGROUND

A memory device using a variable resistance element as a storage element is known. A variable resistance element functions as a memory cell when coupled to a switching element in series. As a switching element, a 2-terminal type switching element is used.

DETAILED DESCRIPTION

In general, according to one embodiment, a memory device includes a plurality of first interconnects in a first direction, a plurality of second interconnects in a second direction intersecting the first direction, and a plurality of memory cells. Each of the plurality of memory cells is associated with a set of one of the plurality of first interconnects and one of the plurality of second interconnects between the plurality of first interconnects and the plurality of second interconnects and includes a variable resistance element and a switching element which are coupled in series. A forming method of the memory device includes: selecting a memory cell having a highest interconnect resistance from memory cells on which a forming process has not been performed; performing a forming process on a switching element in the selected memory cell; and repeating the selecting and the performing on the plurality of memory cells.

Hereinafter, embodiments will be described with reference to the drawings. In the descriptions below, components having the same functions and configurations will be denoted by the same reference symbols. To distinguish a plurality of structural elements having a common reference symbol from each other, an appended symbol is added after the common reference symbol.

1. Embodiment

An embodiment will be described.

1.1 Configuration

1.1.1 Memory System

Figure 1:
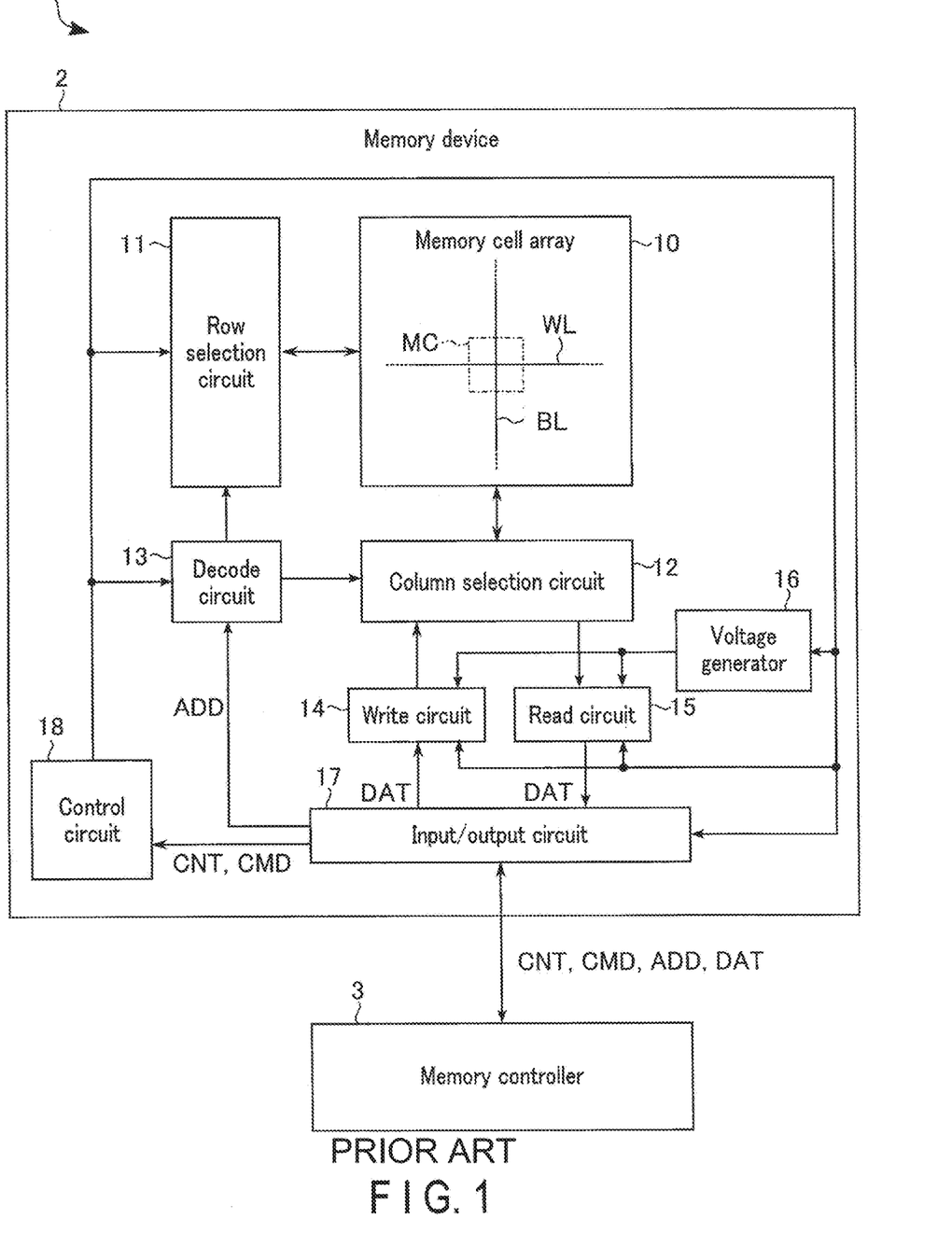
FIG. 1 is a block diagram showing a configuration example of a memory system including a memory device according to an embodiment.

A configuration of a memory system that includes a memory device according to the embodiment will be described. FIG. 1 is a block diagram showing a configuration example of a memory system including a memory device according to the embodiment.

A memory system 1 is a storage device. The memory system 1 performs a data write processing and a data read processing. The memory system 1 includes a memory device 2 and a memory controller 3.

The memory device 2 is a magnetic memory device (magnetoresistive random access memory, MRAM), for example. The memory device 2 stores data in a nonvolatile manner. The memory device 2 includes a plurality of storage elements. The storages element is, for example, a magnetoresistance effect element. The magnetoresistance effect element is a type of variable resistance element having a magnetoresistance effect brought by a magnetic tunnel junction (MTJ). The magnetoresistance effect element may be called an MTJ element.

The memory controller 3 is configured as an integrated circuit such as a system-on-a-chip (SoC). The memory controller 3 causes the memory device 2 to perform a write processing and a read processing in response to a request from an externally located host device (not shown). In a write processing, the memory controller 3 sends data to be written to the memory device 2. In a read processing, the memory controller 3 receives data that is read from the memory device 2.

1.1.2 Memory Device

Next, an internal configuration of the memory device according to the embodiment will be described with continuous reference to FIG. 1.

The memory device 2 includes a memory cell array 10, a row selection circuit 11, a column selection circuit 12, a decode circuit 13, a write circuit 14, a read circuit 15, a voltage generator 16, an input/output circuit 17, and a control circuit 18.

The memory cell array 10 is a data storage unit in the memory device 2. The memory cell array 10 includes a plurality of memory cells MC. Each of the memory cells MC is associated with a set of a row and a column. The memory cells MC of the same row are coupled to the same word line WL, and the memory cells MC of the same column are coupled to the same bit line BL.

The row selection circuit 11 is a circuit for selecting a row of the memory cell array 10. The row selection circuit 11 is coupled to the memory cell array 10 via word lines WL. The row selection circuit 11 is supplied with a decoding result of an address ADD from the decode circuit 13 (row address). The row selection circuit 11 selects a word line WL corresponding to a row based on the decoding result of the address ADD. Hereinafter, a word line WL which is selected will be called a "selected word line WL". Word lines WL other than the selected word line WL will be called "non-selected word lines WL".

The column selection circuit 12 is a circuit for selecting a column of the memory cell array 10. The column selection circuit 12 is coupled to the memory cell array 10 via bit lines BL. The column selection circuit 12 is supplied with a decoding result of an address ADD received from the decode circuit 13 (column address). The column selection circuit 12 selects a bit line BL corresponding to a column based on the decoding result of the address ADD. Hereinafter, a bit line BL which is selected will be called a "selected bit line BL". Bit lines BL other than the selected bit line BL will be called "non-selected bit lines BL".

A memory cell MC specified by a selected word line WL and a selected bit line BL is called a "selected memory cell MC". The memory cells MC other than the selected memory cell MC will be called "non-selected memory cells MC". It is possible to pass a predetermined current thorough a selected memory cell MC via a selected word line WL and a selected bit line BL.

The decode circuit 13 is a decoder that decodes an address ADD received from the input/output circuit 17. The decode circuit 13 supplies the decoding result of an address ADD to the row selection circuit 11 and the column selection circuit 12. The address ADD includes an address of a column to be selected and an address of a row to be selected.

The write circuit 14 includes a write driver (not shown), for example. The write circuit 14 writes data in a memory cell MC in a write processing.

The read circuit 15 includes, for example, a sense amplifier (not shown). The read circuit 15 reads data from a memory cell MC in a read processing.

The voltage generator 16 generates voltages for various types of processing in the memory cell array 10, using a power supply voltage supplied from a device (not shown) externally to the memory device 2. For example, the voltage generator 16 generates various types of voltages required in a write processing and outputs the voltages to the write circuit 14. In addition, the voltage generator 16, for example, generates various types of voltages required in a read processing and outputs the voltages to the read circuit 15.

The input/output circuit 17 governs communications with the memory controller 3. The input/output circuit 17 transfers an address ADD received from the memory controller 3 to the decode circuit 13. The input/output circuit 17 also transfers a command CMD received from the memory controller 3 to the control circuit 18. The input/output circuit 17 allows the transmission and reception of various control signals CNT between the memory controller 3 and the control circuit 18. The input/output circuit 17 transfers data DAT received from the memory controller 3 to the write circuit 14. The input/output circuit 17 outputs data DAT transferred from the read circuit 15 to the memory controller 3.

The control circuit 18 includes, for example, a processor, such as a central processing unit (CPU), and a read only memory (ROM). The control circuit 18 controls, based on a control signal CNT and a command CMD, the circuits included in the memory device 2, namely the row selection circuit 11, the column selection circuit 12, the decode circuit 13, the write circuit 14, the read circuit 15, the voltage generator 16, and the input/output circuit 17.

1.1.3 Memory Cell Array

Figure 2:
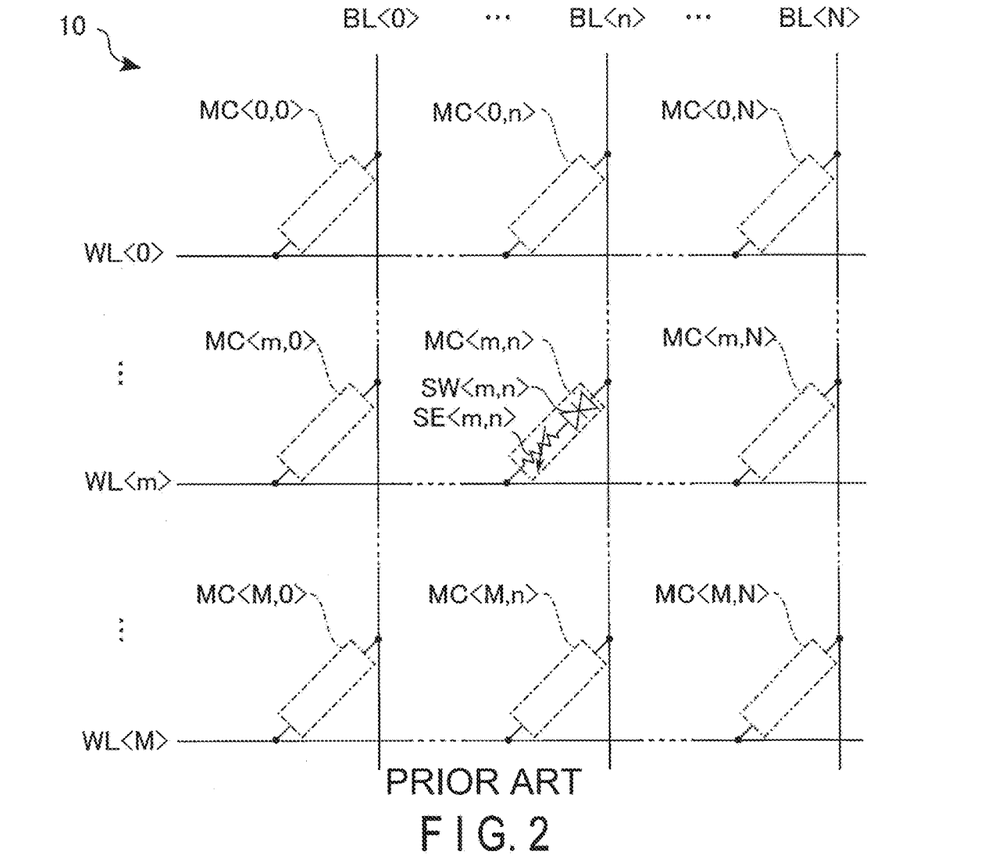
FIG. 2 is a circuit diagram showing a circuit configuration example of a memory cell array according to the embodiment.

Next, a circuit configuration of the memory cell array of the memory device according to the embodiment will be described.

FIG. 2 is a circuit diagram showing a circuit configuration example of the memory cell array according to the embodiment. In FIG. 2, the word lines WL and the bit lines BL are distinguished by appended letters including indices ("< >"). The word lines WL extend in a first direction and the bit lines BL extend in a second direction intersecting the first direction.

The memory cell array 10 includes a plurality of memory cells MC, a plurality of word lines WL, and a plurality of bit lines BL. In the example shown in FIG. 2, a plurality of memory cells MC include (M+1)×(N+1) memory cells, MC <0, 0>, . . . , MC <0, N>, . . . , MC <M, 0>, . . . , and MC <M, N> (each of M and N is an integer equal to or greater than 1). Each of M and N is an integer equal to or greater than 1 in the example of FIG. 2; however, the embodiment is not limited to this example. M and N may be 0. The plurality of word lines WL include (M+1) word lines, WL <0>, . . . , and WL <M>. The plurality of bit lines BL include (N+1) bit lines, BL <0>, . . . , and BL <N>.

A plurality of memory cells MC are arranged in a matrix pattern. Each memory cell MC is associated with a set of a single word line WL and a single bit line BL. In other words, a memory cell MC <m, n> (0≤m≤M, 0≤n≤N) is coupled to a word line WL <m> and a bit line BL <n>. The memory cell MC <m, n> includes a switching element SW <m, n>, and a variable resistance element SE <m, n>. The switching element SW <m, n> and the variable resistance element SE <m, n> are coupled in series.

The switching element SW is a 2-terminal type switching element. 2-terminal type switching element differs from a 3-terminal type switching element, such as a transistor, etc., in its having no third terminal. More specifically, for example, if a voltage applied to a corresponding memory cell MC is lower than a threshold voltage Vth, the switching element SW interrupts a current (turns to an off state), serving as an insulator having a large resistance value. If a voltage applied to a corresponding memory cell MC is equal to or higher than the threshold voltage Vth, the switching element SW passes a current (turns to an on state), serving as a conductor having a small resistance value. The switching element SW switches between passing and interrupting a current in accordance with a magnitude of a voltage applied to a corresponding memory cell MC, regardless of the polarity of the voltage applied to the two terminals (in other words, regardless of the direction of the current passing between the two terminals).

According to the configuration described above, when a memory cell MC is selected, the switching element SW included in the selected memory cell MC is turned to an on state. It is thereby possible to pass a current into the variable resistance element SE in the selected memory cell MC.

The variable resistance element SE is a storage element. The variable resistance element SE may switch its resistance value between a low-resistance state and a high-resistance state based on a current that flows when the switching element SW is in an on state. The variable resistance element SE stores data in a nonvolatile manner according to the change in its resistance state.

1.1.4 Variable Resistance Element

Figure 3:
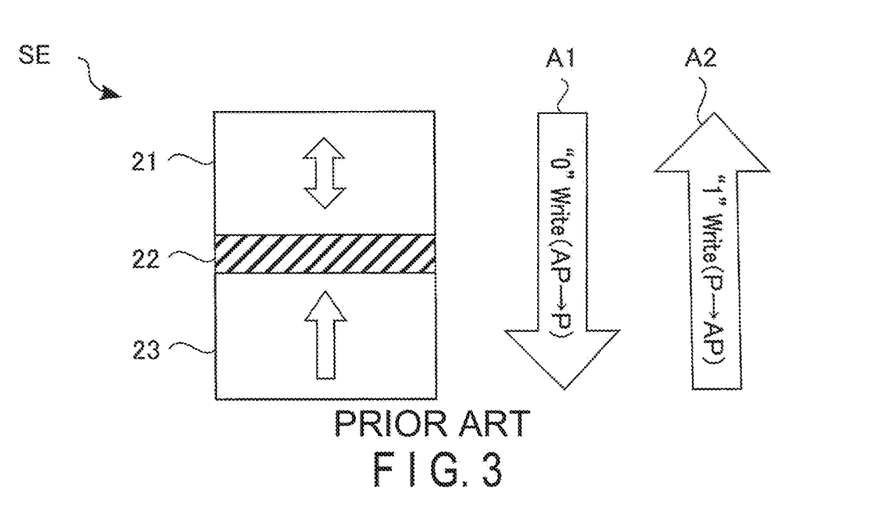
FIG. 3 is a cross-sectional view showing a configuration example of a variable resistance element according to the embodiment.

Next, a configuration of the variable resistance element according to the embodiment will be described.

FIG. 3 is a cross-sectional view showing a configuration example of the variable resistance element according to the embodiment. FIG. 3 shows an example of a configuration of the variable resistance element SE in a case where it is a magnetoresistance effect element (MTJ element). In the case where the variable resistance element SE is a magnetoresistance effect element, it includes a ferromagnetic layer 21, a nonmagnetic layer 22, and a ferromagnetic layer 23. The ferromagnetic layer 21, the nonmagnetic layer 22, and the ferromagnetic layer 23 are stacked above a semiconductor substrate (not shown).

The ferromagnetic layer 21 is an electric conductive film having ferromagnetic properties. The ferromagnetic layer 21 is used as a storage layer. The ferromagnetic layer 21 has an axis of easy magnetization in a direction perpendicular to the layer stack plane. The magnetization direction of the ferromagnetic layer 21 is variable. The ferromagnetic layer 21 includes iron (Fe). The ferromagnetic layer 21 may further include at least one of cobalt (Co) or nickel (Ni). The ferromagnetic layer 21 may further include boron (B). Specifically, the ferromagnetic layer 21 may include, for example, cobalt-iron-boron (FeCoB) or iron boride (FeB).

On the film surface of the ferromagnetic layer 21, the nonmagnetic layer 22 is provided. The nonmagnetic layer 22 is an insulating film having nonmagnetic properties. The nonmagnetic layer 22 is used as a tunnel barrier layer. The nonmagnetic layer 22 is provided between the ferromagnetic layer 21 and the ferromagnetic layer 23, and forms a magnetic tunnel junction in conjunction with these two ferromagnetic layers. In addition, during a crystallization process of the ferromagnetic layer 21, the nonmagnetic layer 22 also functions as a seed material that serves as a nucleus for growth of a crystalline film from an interface with the ferromagnetic layer 21. The nonmagnetic layer 22 has a NaCl crystal structure with its film plane oriented in a (001) plane. The nonmagnetic layer 22 includes magnesium oxide (MgO).

The ferromagnetic layer 23 is provided on a film plane of the nonmagnetic layer 22 located opposite to a film plane on which the ferromagnetic layer 21 is provided with respect to the nonmagnetic layer 22. The ferromagnetic layer 23 is an electric conductive film having ferromagnetic properties. The ferromagnetic layer 23 is used as a reference layer. The ferromagnetic layer 23 has an axis of easy magnetization in a direction perpendicular to the film plane. The magnetization direction of the ferromagnetic layer 23 is fixed. In the example shown in FIG. 3, the magnetization direction of the ferromagnetic layer 23 is in the direction of the ferromagnetic layer 21. "Fixed magnetization direction" indicates the magnetization direction being unchanged by a torque large enough to reverse the magnetization direction of the ferromagnetic layer 21. The ferromagnetic layer 23 includes at least one compound selected from the group consisting of, for example, cobalt platinum (CoPt), cobalt nickel (CoNi), and cobalt palladium (CoPd).

The magnetoresistance effect element may take either a low-resistance state or a high-resistance state, according to whether the relative relationship between the magnetization direction of the storage layer and the magnetization direction of the reference layer is parallel or antiparallel. In the following, a case where a spin injection write method is used as a method of varying the resistance state of the magnetoresistance effect element will be explained. With the spin injection write method, a spin torque is produced by passing a write current through the magnetoresistance effect element. Then, with the produced spin torque, the magnetization direction of the storage layer with respect to the magnetization direction of the reference layer is controlled.

When a write current Iw0 flows in the magnetoresistance effect element from the storage layer to the reference layer (in the direction of arrow A1 in FIG. 3), the relative relationship of the magnetization direction between the storage layer and the reference layer becomes parallel. When the relationship is in a parallel state, the magnetoresistance effect element is set to a low-resistance state. The low-resistance state is associated with data "0", for example. The low-resistance state is also referred to as a "P (parallel) state".

When a write current Iw1, which is larger than the write current Iw0, flows in the magnetoresistance effect element from the reference layer to the storage layer (in the direction of arrow A2 in FIG. 3), the relative relationship of the magnetization direction between the storage layer and the reference layer becomes anti-parallel. When the relationship is in an anti-parallel state, the magnetoresistance effect element is set to a high-resistance state. The high-resistance state is associated with data "1", for example. The high-resistance state is also referred to as an "AP (anti-parallel) state".

When a read current Ir flows in the magnetoresistance effect element, the magnetization directions of the storage layer and the reference layer do not change. The read circuit 15 determines whether the resistance state of the magnetoresistance effect element is a P state or an AP state based on the read current Ir. It is thereby possible for the read circuit 15 to read data from a memory cell MC.

The correspondence between the resistance state and data is not limited to the foregoing example. For example, a P state and an AP state may be associated with data "1" and data "0", respectively. The polarity of a read current Ir may be negative.

1.2 Operations

Next, as an operation in the memory device according to the embodiment, the forming process will be described. The forming process is a process for changing the current-voltage characteristic of the switching element SW from an initial state. The forming process is performed, for example, before shipment of the memory device 2. In other words, the memory device 2 is shipped after the current-voltage characteristic of the switching element SW is changed from the initial state by the forming process, so that the write processing and the read processing can be performed.

1.2.1 Change of Characteristics of Switching Element

Figure 4:
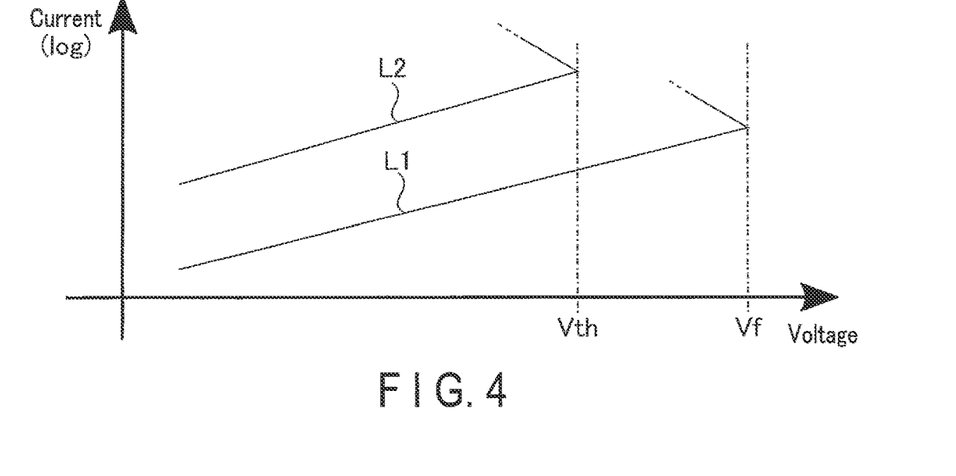
FIG. 4 is a diagram showing an example of current-voltage characteristics of a switching element before and after a forming process in the memory device according to the embodiment.

FIG. 4 is a diagram showing an example of current-voltage characteristics of the switching element before and after the forming process in the memory device according to the embodiment. The current-voltage characteristics shown in FIG. 4 indicate logarithmic values of a current relative to a voltage. In the example of FIG. 4, line L1 represents a current-voltage characteristic of the switching element SW that is mainly in an off state before the forming process (namely, in the initial state). Line L2 represents a current-voltage characteristic of the switching element SW that is mainly in an off state after the forming process.

The forming process is performed by application of a voltage equal to or higher than a forming voltage Vf to the switching element SW. The current-voltage characteristic of the switching element SW is changed from the state represented by line L1 to the state represented by line L2 by application of a voltage equal to or higher than the forming voltage Vf to the switching element SW.

As represented by line L1, before the forming process, the switching element SW turns to the on state by application of a potential difference equal to or higher than the forming voltage Vf to the switching element SW. In other words, the forming voltage Vf may be considered to be a threshold voltage of the switching element SW before the forming process is performed. On the other hand, as represented by line L2, after the forming process, the switching element SW turns to the on state by application of a potential difference equal to or higher than the threshold voltage Vth, which is lower than the forming voltage Vf, to the switching element SW. Thus, the threshold voltage of the switching element SW is lowered from the forming voltage Vf to the threshold voltage Vth by the forming process. Furthermore, the amount of current flowing through the switching element SW in the off state is greater after the forming process than before the forming process.

1.2.2 Applied Voltage

Figure 5:
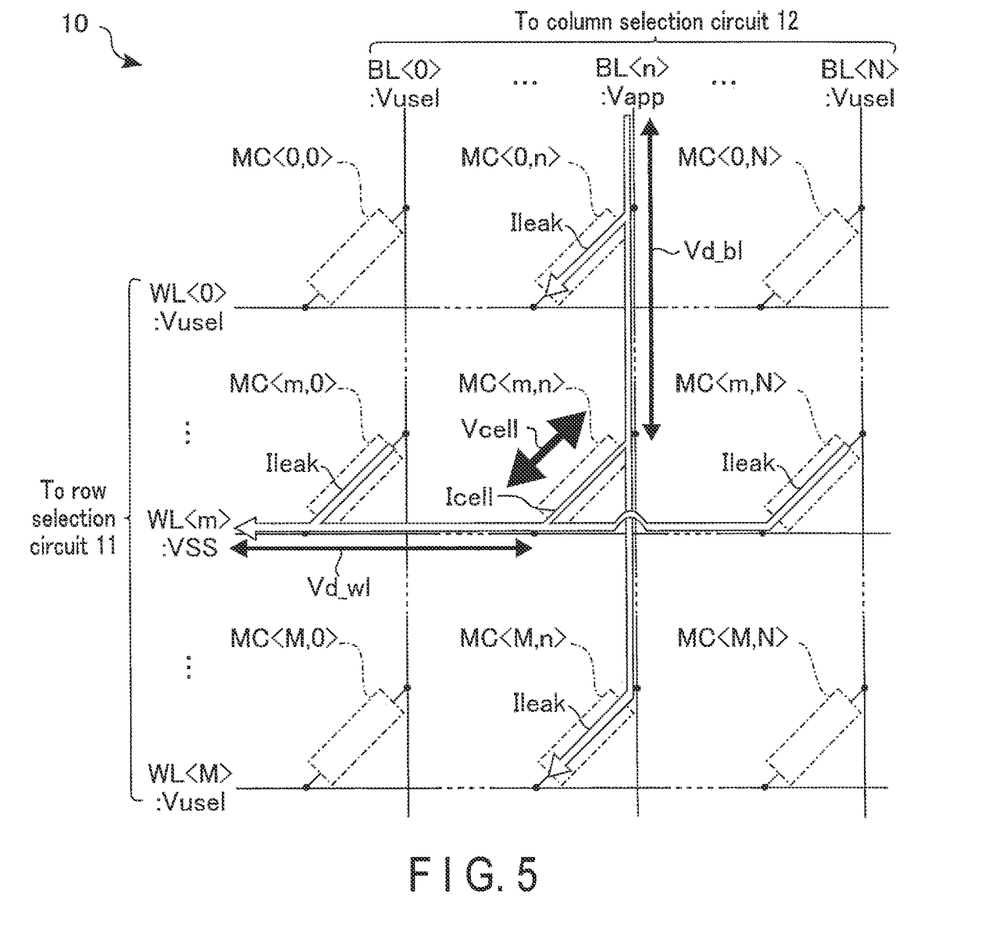
FIG. 5 is a diagram showing an example of voltages applied in the forming process of memory cells in the memory device according to the embodiment.

FIG. 5 is a view showing an example of voltages applied in the forming process of memory cells in the memory device according to the embodiment. The example of FIG. 5 shows a voltage applied to the memory cell array 10 in a case where the forming process is performed on the switching element SW <m, n> of the memory cell MC <m, n>.

In the case where the forming process is performed on the switching element SW <m, n>, the row selection circuit 11 applies a voltage VSS to, for example, the word line WL <m>. The column selection circuit 12 applies a voltage Vapp to, for example, the bit line BL <n>. The voltage VSS is, for example, 0 V. The voltage Vapp is higher than the forming voltage Vf.

The row selection circuit 11 applies a voltage Vusel to all word lines WL other than the word line WL <m>. The column selection circuit 12 applies the voltages Vusel to all bit lines BL other than the bit line BL <n>. The voltage Vusel is higher than the voltage VSS and lower than the voltage Vapp. The voltage Vusel is a voltage that turns the switching element SW to the off state regardless of whether it is before or after the forming process. In other words, the voltage Vusel is lower than the threshold voltage Vth. The voltage Vusel is, for example, Vapp/2.

Accordingly, the potential difference Vapp is applied to the memory cell MC <m, n>, assuming that interconnect resistances of the word lines WL and the bit lines BL are ignored. The state of the memory cell MC <m, n> is referred to as a "selection state". For example, the potential difference Vapp/2 is applied to memory cells coupled to the word line WL <m> or the bit line BL <n> other than the memory cell MC <m, n>, namely, memory cells MC <0, n> through MC <m−1, n>, MC <m+1, n> through MC <M, n>, MC <m, 0> through MC <m, n−1>, and MC <m, n+1> through MC <m, N>, of all memory cells. The state of the memory cells MC <0, n> through MC <m−1, n>, MC <m+1, n> through MC <M, n>, MC <m, 0> through MC <m, n−1>, and MC <m, n+1> through MC <m, N> is referred to as a "half-selection state". There is no potential difference in any memory cells MC other than the memory cells MC coupled to the word line WL <m> or the bit line BL <n>. The state of all memory cells MC that are neither in the selection state nor the half-selection state is referred to as a "non-selection state".

In an actual forming process, interconnect resistances of the word lines WL and the bit lines BL may not be ignorable. If interconnect resistances of the word lines WL and the bit lines BL are not ignorable, a potential difference Vcell applied to the memory cell MC <m,n> in the selection state is approximately expressed by using the potential difference Vapp in the equation below. By application of a potential difference Vcell that is equal to or higher than the forming voltage Vf in the following equation, the current-voltage characteristic of the switching element SW <m, n> can be changed from the state of line L1 to the state of line L2 shown in FIG. 4.

$$V\text{cell} = V app - (Vd\_wl + Vd\_bl)$$
$$\approx V app - (R\_WL + R\_BL) \times (I\text{cell} + \Sigma I \text{leak})$$

In the equation, Vd_wl and Vd_bl are amounts of voltage drop that occur in the word line WL <m> and the bit line BL <n>, respectively. R_WL is an interconnect resistance in a portion from the row selection circuit 11 to the memory cell MC <m, n> of the word line WL <m>. R_BL is an interconnect resistance in a portion from the column selection circuit 12 to the memory cell MC <m, n> of the bit line BL <n>. Icell is a current flowing through the memory cell MC <m, n>. Ileak is a leakage current flowing through the memory cells MC other than the memory cell MC <m, n>. ΣIleak is a sum of leakage currents Ileak (total leakage current).

In the forming process described above, during a period until the potential difference Vcell reaches the forming voltage Vf, the current Icell can be regarded as 0. Therefore, a difference between the potential difference Vapp and the potential difference Vcell can be regarded as being caused by a product of the leakage current Ileak and the interconnect resistances R_WL and R_BL.

1.2.3 Flowchart

Figure 6:
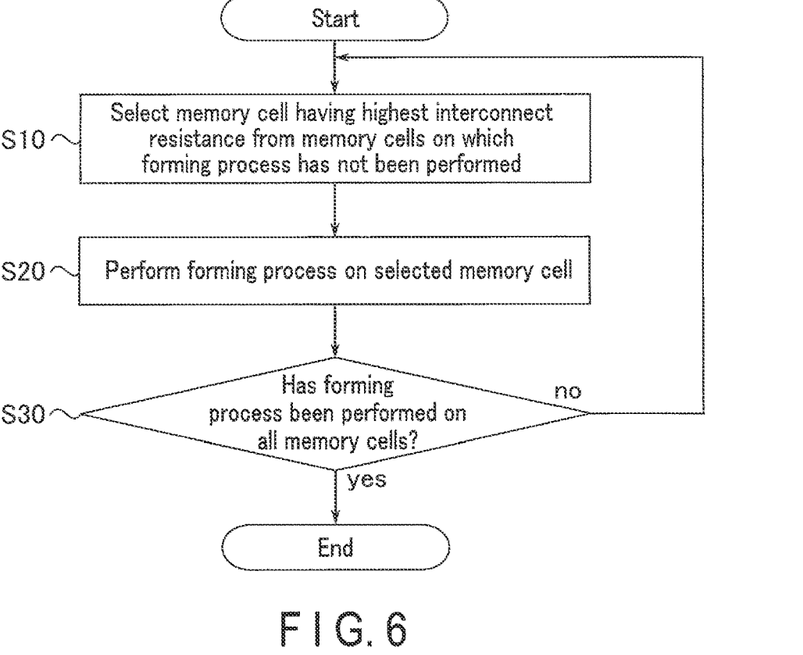
FIG. 6 is a flowchart showing an overview of the forming process of a memory cell array in the memory device according to the embodiment.

FIG. 6 is a flowchart showing an overview of the forming process of the memory cell array in the memory device according to the embodiment.

Upon receipt of a command to start the forming process from the memory controller 3 (Start), the control circuit 18 selects a memory cell MC having a highest interconnect resistance from the memory cells MC on which the forming process has not been performed (S10).

The control circuit 18 performs the forming process on the memory cell MC selected by the process of S10 (S20). Specifically, if the memory cell MC <m, n> is selected by the process of S10, the row selection circuit 11 applies the voltage VSS to the word line WL <m>, and applies the voltage Vusel to all word lines WL other than the word line WL <m>. The column selection circuit 12 applies the voltage Vapp to the bit line BL <n>, and applies the voltage Vusel to all bit lines BL other than the bit line BL <n>. As a result, a potential difference Vcell equal to or higher than the forming voltage Vf is applied to the switching element SW <m, n> of the memory cell MC <m, n>. Thus, the current-voltage characteristic of the switching element SW <m, n> changes from the initial state.

After the process of S20, the control circuit 18 determines whether the forming process has been performed on all memory cells MC (S30).

If there is a memory cell MC on which the forming process has not been performed (S30; no), the control circuit 18 selects a memory cell MC having a highest interconnect resistance from the memory cells MC on which the forming process has not been performed (S10). Then, the control circuit 18 performs the forming process on the memory cell MC selected by the process of S10 (S20). As described above, the processes of S10 and S20 are repeated until the forming process is performed on all memory cells MC.

If the forming process has been performed on all memory cells MC (S30; yes), the forming process of the memory cell array 10 ends (End).

1.3. Advantageous Effects of Embodiment

According to the embodiment, the control circuit 18 selects a memory cell MC having a highest interconnect resistance (R_WL+R_BL) from the memory cells MC on which the forming process has not been performed. The control circuit 18 performs the forming process on the switching element SW in the selected memory cell MC. The control circuit 18 repeats the selecting and the performing on all memory cells MC in the memory cell array 10. Accordingly, the reliability of the switching element SW after the forming process can be improved. The effect will be described below.

Figure 7:
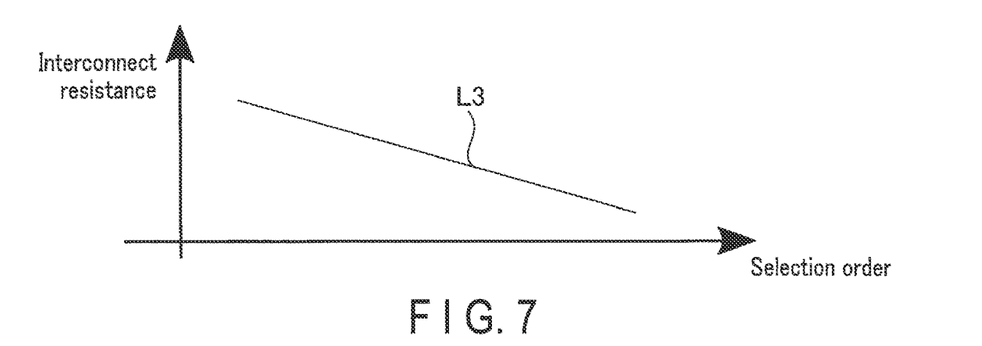
FIG. 7 is a diagram showing an example of a relationship between a selection order and an interconnect resistance of the memory cells in the forming process of the memory cell array in the memory device according to the embodiment.
Figure 8:
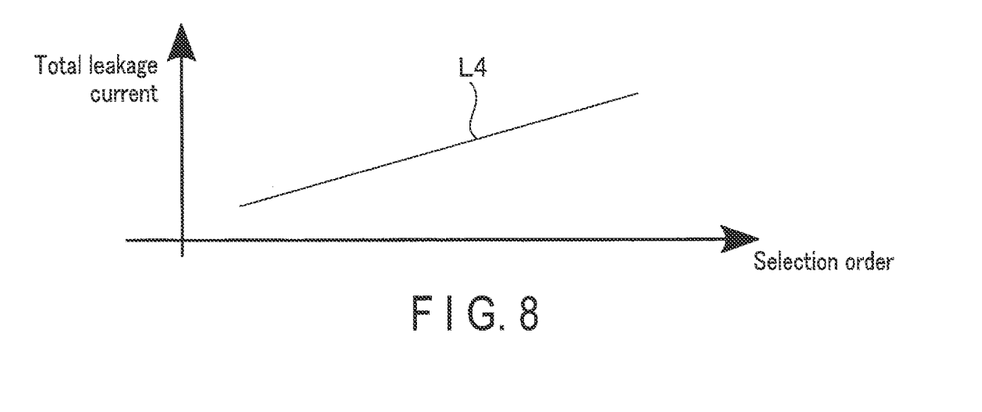
FIG. 8 is a diagram showing an example of a relationship between a selection order and a total leakage current of the memory cells in the forming process of the memory cell array in the memory device according to the embodiment.

FIG. 7 is a diagram showing an example of a relationship between a selection order and an interconnect resistance of the memory cells in the forming process of the memory cell array in the memory device according to the embodiment. FIG. 8 is a diagram showing an example of a relationship between a selection order and a total leakage current of the memory cells in the forming process of the memory cell array in the memory device according to the embodiment. FIG. 7 and FIG. 8 respectively show an interconnect resistance (R_WL+R_BL) and a total leakage current ΣIleak in the vertical axis with respect to a selection order in the horizontal axis.

As shown in FIG. 7, in the case where the memory cells MC are selected in the order from a memory cell MC having a highest interconnect resistance (R_WL+R_BL) out of all memory cells MC on which the forming process has not been performed, the interconnect resistance (R_WL+R_BL) decreases later in the selection order.

On the other hand, the number of memory cells MC on which the forming process has been performed increases later in the selection order. Therefore, the number of memory cells MC on which the forming process has been performed out of all memory cells MC in the half-selection state increases later in the selection order.

The leakage current Ileak flowing through the memory cells MC in the half-selection state is greater in the case where the forming process has been performed on the memory cells MC in the half-selection state than in the case where the forming process has not been executed in the half-selection state. Therefore, as shown in FIG. 8, the total leakage current ΣIleak increases later in the selection order.

As described above, according to the forming method of the embodiment, in a memory cell MC that is selected comparatively earlier, the interconnect resistance (R_WL+R_BL) is comparatively higher, while the total leakage current ΣIleak can be comparatively smaller. In contrast, in a memory cell MC that is selected comparatively later, the total leakage current ΣIleak is comparatively greater, while the interconnect resistance (R_WL+R_BL) can be comparatively lower. Thus, it is possible to suppress a large change in the product of the interconnect resistance (R_WL+R_BL) and the total leakage current ΣIleak due to the selection order. Therefore, a variation in the potential difference Vcell between memory cells in an earlier order and a later order can be suppressed. Accordingly, by applying a potential difference Vcell that is lower than the forming voltage Vf, a failure in changing the current-voltage characteristic of the switching element SW (a forming failure) can be suppressed. By applying a potential difference Vcell that is excessively higher than the forming voltage Vf, for example, the nonmagnetic layer 22 of the variable resistance element SE of the selected memory cell MC can be suppressed from insulation breakdown.

2. Modifications, Etc.

Various modifications are applicable to the embodiment described above.

2.1. First Modification

For example, the order of performing the forming process may be determined on the basis of an interconnect length.

Figure 9:
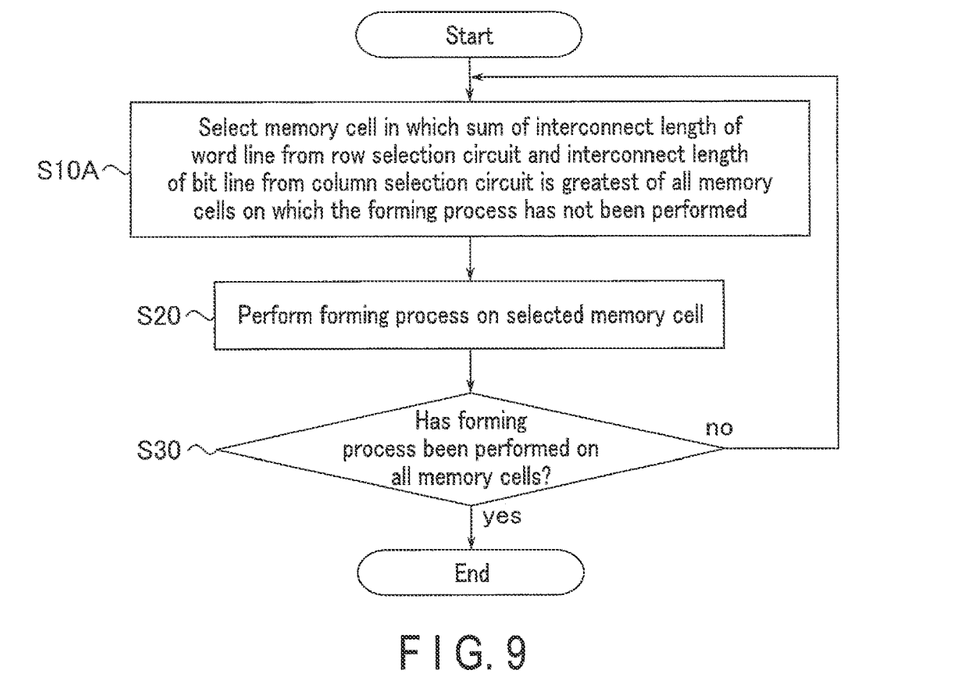
FIG. 9 is a flowchart showing a forming process of a memory cell array in a memory device according to a first modification.

FIG. 9 is a flowchart showing an example of a forming process of a memory cell array in a memory device according to a first modification. FIG. 9 corresponds to FIG. 6 of the embodiment.

Upon receipt of a command to start the forming process from the memory controller 3 (Start), the control circuit 18 selects a memory cell MC in which the sum of an interconnect length of the word line WL from the row selection circuit 11 and an interconnect length of the bit line BL from the column selection circuit 12 is the greatest of all memory cells MC on which the forming process has not been performed (S10A).

The control circuit 18 performs the forming process on the memory cell MC selected by the process of S10A (S20).

After the process of S20, the control circuit 18 determines whether the forming process has been performed on all memory cells MC (S30).

If there is a memory cell MC on which the forming process has not been performed (S30; no), the control circuit 18 selects a memory cell MC in which the sum of an interconnect length of the word line WL from the row selection circuit 11 and an interconnect length of the bit line BL from the column selection circuit 12 is the greatest of all memory cells MC on which the forming process has not been performed (S10A). Then, the control circuit 18 performs the forming process on the memory cell MC selected by the process of S10A (S20). As described above, the processes of S10A and S20 are repeated until the forming process is performed on all memory cells MC.

If the forming process has been performed on all memory cells MC (S30; yes), the forming process of the memory cell array 10 ends (End).

According to the first modification, without impairing the reliability of the switching element SW due to the forming process, a memory cell MC having a higher interconnect resistance can be selected more easily than in the case where the interconnect resistance is directly evaluated.

2.2. Second Modification

Alternatively, the order of performing the forming process may be determined on the basis of a product of an interconnect length and a sheet resistance.

Figure 10:
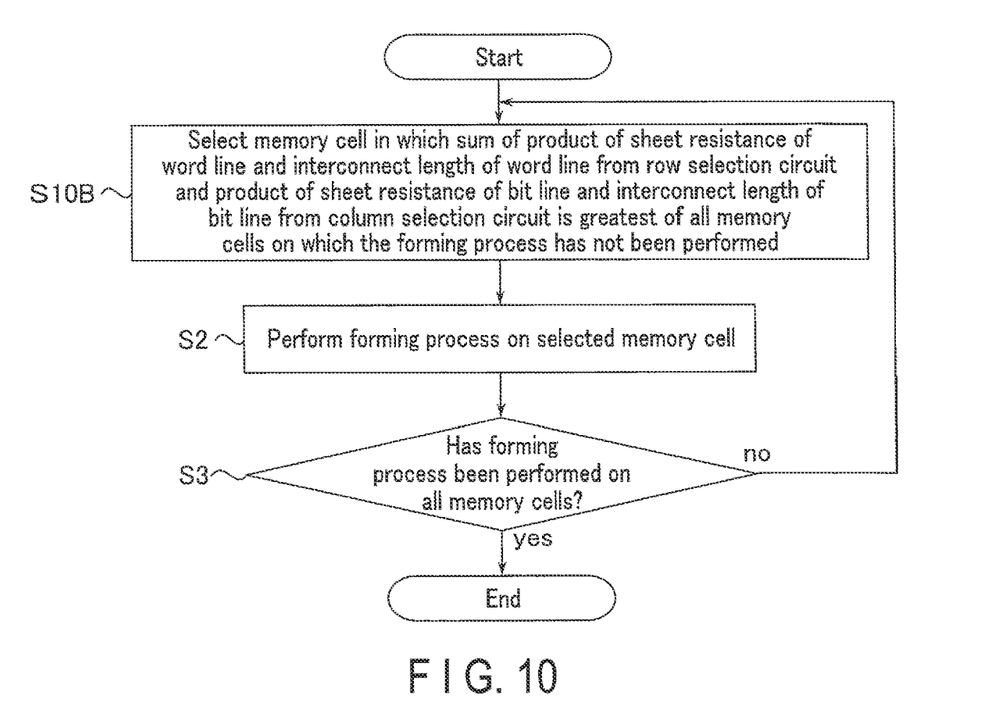
FIG. 10 is a flowchart showing a forming process of a memory cell array in a memory device according to a second modification.

FIG. 10 is a flowchart showing an example of a forming process of a memory cell array in a memory device according to a second modification. FIG. 10 corresponds to FIG. 6 of the embodiment.

Upon receipt of a command to start the forming process from the memory controller 3 (Start), the control circuit 18 selects a memory cell MC in which the sum of a product of a sheet resistance of the word line WL and an interconnect length of the word line WL from the row selection circuit 11 and a product of a sheet resistance of the bit line BL and an interconnect length of the bit line BL from the column selection circuit 12 is the greatest of all memory cells MC on which the forming process has not been performed (SLOB).

The control circuit 18 performs the forming process on the memory cell MC selected by the process of S10B (S20).

After the process of S20, the control circuit 18 determines whether the forming process has been performed on all memory cells MC (S30).

If there is a memory cell MC on which the forming process has not been performed (S30; no), the control circuit 18 selects a memory cell MC in which the sum of a product of a sheet resistance of the word line WL and an interconnect length of the word line WL from the row selection circuit 11 and a product of a sheet resistance of the bit line BL and an interconnect length of the bit line BL from the column selection circuit 12 is the greatest of all memory cells MC on which the forming process has not been performed (SLOB). Then, the control circuit 18 performs the forming process on the memory cell MC selected by the process of S10B (S20). As described above, the processes of S10B and S20 are repeated until the forming process is performed on all memory cells MC.

If the forming process has been performed on all memory cells MC (S30; yes), the forming process of the memory cell array 10 ends (End).

According to the second modification, even if the word line WL and the bit line BL are different in sheet resistance, the forming process can be performed sequentially on the memory cells MC in the order of highest to lowest interconnect resistance. Therefore, the same effects as in the embodiment can be attained.

3. Others

In the embodiment, the first modification, and the second modification, the case is described in which the selection order in the forming process is determined based on the magnitude of the interconnect resistance (R_WL+R_BL) of the memory cell MC; however, the embodiment is not limited to this case. For example, if an address is known of a memory cell MC in which a large leakage current Ileak easily flows regardless of the magnitude of the interconnect resistance (R_WL+R_BL) of the memory cell MC due to the production process or the characteristics of the layout of the memory cell array 10, the forming process of this memory cell MC may be preferentially executed first. Alternatively, for example, if an address is known of a memory cell MC in which a forming failure is prone to occur regardless of the magnitude of the interconnect resistance (R_WL+R_BL) of the memory cell MC due to the production process or the characteristics of the layout of the memory cell array 10, the forming process of this memory cell MC may be preferentially executed first.

In the foregoing embodiment, the first modification, and the second modification, the case is described in which the forming process is applied to a magnetic memory device, such as an MRAM; however, the embodiment is not limited to this case. For example, the forming process described above is applicable to a resistance change memory similar to an MRAM, for example, a phase-change random access memory (PCRAM) and a resistive random access memory (ReRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The embodiments and their modifications are covered by the accompanying claims and their equivalents, as would fall within the scope and gist of the inventions.

What is claimed is:

1. A forming method performed on a memory device, the memory device including a plurality of first interconnects in a first direction, a plurality of second interconnects in a second direction intersecting the first direction, and a plurality of memory cells, each of the plurality of memory cells being associated with a set of one of the plurality of first interconnects and one of the plurality of second interconnects between the plurality of first interconnects and the plurality of second interconnects and including a variable resistance element and a switching element which are coupled in series, and the forming method comprising:

selecting a memory cell having a highest interconnect resistance from among memory cells of the plurality of memory cells on which a forming process has not been performed;

performing the forming process on the switching element included in the selected memory cell; and repeating the selecting and the performing on the plurality of memory cells, wherein the forming process is a process for changing current-voltage characteristics of the switching element.

2. The forming method according to claim 1, wherein:
    the memory device includes a first circuit configured to select one of the plurality of first interconnects, and a second circuit configured to select one of the plurality of second interconnects; and
    the selecting includes selecting a memory cell in which a sum of a first interconnect length to the first circuit and a second interconnect length to the second circuit is greatest of the memory cells on which the forming process has not been performed.

3. The forming method according to claim 1, wherein:
    each of the plurality of first interconnects has a first sheet resistance;
    each of the plurality of second interconnects has a second sheet resistance;
    the memory device includes a first circuit configured to select one of the plurality of first interconnects, and a second circuit configured to select one of the plurality of second interconnect; and
    the selecting includes selecting a memory cell in which a sum of a product of the first sheet resistance and a first interconnect length to the first circuit and a product of the second sheet resistance and a second interconnect length to the second circuit is greatest of the memory cells on which the forming process has not been performed.

4. The forming method according to claim 3, wherein a first threshold voltage of the switching element after performing the forming process is lower than a second threshold voltage of the switching element before performing the forming process.

5. The forming method according to claim 4, wherein the performing includes:
    applying a first voltage to a first interconnect corresponding to the selected memory cell;
    applying a second voltage lower than the first voltage to a second interconnect corresponding to the selected memory cell; and
    applying a third voltage at a level between the first voltage and the second voltage to all first interconnects other than the first interconnect corresponding to the selected memory cell and all second interconnects other than the second interconnect corresponding to the selected memory cell.

6. The forming method according to claim 5, wherein a difference between the first voltage and the second voltage is higher than the second threshold voltage.

7. The forming method according to claim 5, wherein a difference between the first voltage and the third voltage and a difference between the third voltage and the second voltage are lower than the first threshold voltage.

8. The forming method according to claim 4, wherein the switching element after performing the forming process is turned to an on state upon application of a voltage higher than the first threshold voltage, and turned to an off state upon application of a voltage lower than the first threshold voltage.

9. The forming method according to claim 8, wherein the switching element before performing the forming process is turned to an on state upon application of a voltage higher than the second threshold voltage, and turned to an off state upon application of a voltage lower than the second threshold voltage.

10. The forming method according to claim 9, wherein a current amount in the off state of the switching element after performing the forming process is greater than a current amount in the off state of the switching element before performing the forming process.

11. The forming method according to claim 1, wherein the switching element is a 2-terminal type switching element.

12. The forming method according to claim 1, wherein the memory cell is provided between a pair of a first interconnect and a second interconnect corresponding to each other.

13. The forming method according to claim 1, further comprising performing a write processing and a read processing on the plurality of memory cells after performing the forming process on the plurality of memory cells.

14. The forming method according to claim 1, wherein the variable resistance element includes:
 a first ferromagnetic layer;
 a second ferromagnetic layer; and
 a nonmagnetic layer interposed between the first ferromagnetic layer and the second ferromagnetic layer.

15. The forming method according to claim 1, wherein the plurality of memory cells are arranged in a matrix pattern.

\* \* \* \* \*